(12) United States Patent  (10) Patent No.: US 7,079,444 B2
Lee  (45) Date of Patent: Jul. 18, 2006

(54) MEMORY SYSTEM USING SIMULTANEOUS BI-DIRECTIONAL INPUT/OUTPUT CIRCUIT ON AN ADDRESS BUS LINE

(75) Inventor: Jung-bae Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 68 days.

(21) Appl. No.: 10/974,951

(22) Filed: Oct. 28, 2004

(65) Prior Publication Data

US 2005/0190634 A1 Sep. 1, 2005

(30) Foreign Application Priority Data

Feb. 26, 2004 (KR) ............ 10-2004-0013010

(51) Int. Cl.
*G11C 8/00* (2006.01)
(52) U.S. Cl. ............ 365/230.08; 365/189.05; 365/233.5
(58) Field of Classification Search ........... 365/230.08, 365/230.03, 230.06, 233.5; 710/4
See application file for complete search history.

(56) References Cited

U.S. PATENT DOCUMENTS 6,075,384 A * 6/2000 Sim et al. ............ 326/86
6,127,849 A 10/2000 Walker
2002/0079928 A1 6/2002 Borkar et al.
2002/0095622 A1 7/2002 Haycock et al.
2005/0210196 A1* 9/2005 Perego et al. ............ 711/115

FOREIGN PATENT DOCUMENTS

JP  5-6313  1/1993
KR  1995-0011728  10/1995
KR  10-0201057  3/1999

* cited by examiner

*Primary Examiner*—Tuan T. Nguyen
*Assistant Examiner*—Hien Nguyen
(74) *Attorney, Agent, or Firm*—Volentine Francos & Whitt, PLLC

(57) ABSTRACT

A memory system using a simultaneous bi-directional input/output (SBD I/O) circuit on an address bus line. The memory system includes a first address I/O circuit and a second address I/O circuit, which are connected by the address bus line. The first address I/O circuit may be included in a controller, transmits an address signal to the address bus line, and receives an acknowledgement signal from the address bus line. The second address I/O circuit may be included in a memory device (such as dynamic random access memory (DRAM)), transmits the acknowledgement signal to the address bus line, and receives the address signal from the address bus line. The memory system may also include an error correction circuit unit which generates the acknowledgement signal indicating if an error is present in the address signal received by the second address I/O circuit.

22 Claims, 5 Drawing Sheets

$$\begin{cases} P1 = A3 \oplus A5 \oplus A7 \\ P2 = A3 \oplus A6 \oplus A7 \\ P4 = A5 \oplus A6 \oplus A7 \end{cases}$$

MEMORY SYSTEM USING SIMULTANEOUS BI-DIRECTIONAL INPUT/OUTPUT CIRCUIT ON AN ADDRESS BUS LINE

BACKGROUND OF THE INVENTION

1. Field of the Invention

Embodiments of the present invention relate to a memory system using a simultaneous bidirectional input/output (SBD I/O) circuit on an address bus line. This application claims the priority of Korean Patent Application No. 2004-13010, filed on Feb. 26, 2004, in the Korean Intellectual Property Office, the disclosure of which is incorporated herein in its entirety by reference.

2. Description of the Related Art

As operating speeds and computing power of processors develop, in some applications, the processors' computing capacity exceeds the speed at which data can be transmitted from peripheral devices to the processors. Limitations of the data rate between the processors and peripheral devices (i.e. limitations of data bandwidth) may result in operational limitations of the processor system. A data bandwidth of a processor system may be increased by increasing a size of a data bus. In a personal computer (PC) system, a data bus may have 8-, 16-, 32-, 64-, and 128-bit widths, periodically doubling. Other applications may mitigate data bandwidth problems by using a larger data bus. For example, in a parallel computing system, a plurality of parallel processors use data buses which are several hundreds of bits in width. Extension of a data bus width is limited by physical requirements of integrated circuits (ICs) connected to the data bus. ICs may be packed into a package and connected to a bus line through package pins. Packages may not have enough pins to be connected to hundreds of bus lines of a system, because of practical limitations on the size of the packages.

Figure 1:
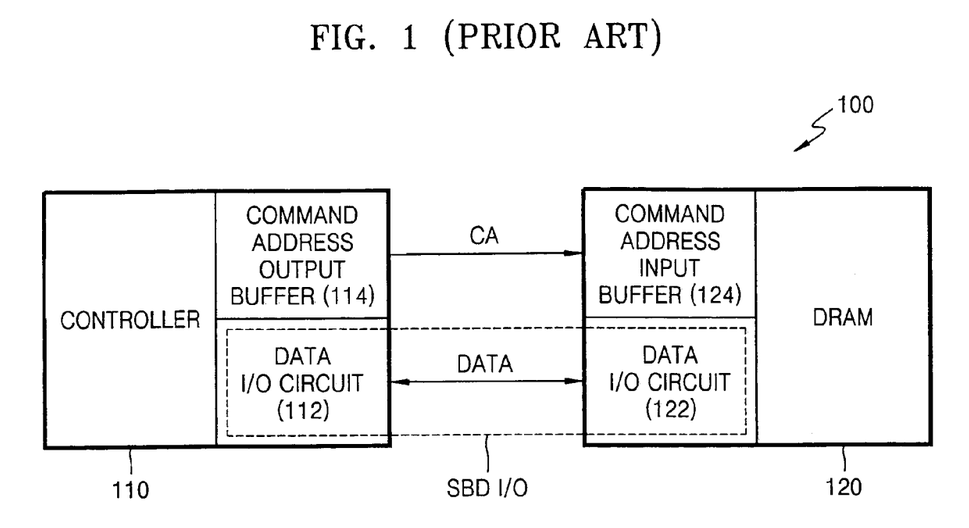
FIG. 1 illustrates an example of a memory system having a signal transmission system.

An SBD I/O circuit is used to increase a data bandwidth, without increasing bus size. In a system using the SBD I/O circuit, data transmission and data reception are simultaneously performed through a single data line, which effectively doubles the data bandwidth without physically increasing the bus size. Such a SBD I/O circuit is disclosed in U.S. Pat. No. 6,127,849. The SBD I/O circuit is present between data bus lines and performs simultaneous bi-directional data transmission. FIG. 1 illustrates a memory system using the SBD I/O circuit.

Referring to FIG. 1, a memory system 100 includes a memory controller 110 and a memory device 120 (e.g. a dynamic random access memory (DRAM)). The memory controller 110 and the memory device 120 are usually connected via an address bus line CA and a data bus line DATA. The data bus line DATA is connected between a data I/O circuit 112 of the controller 110 and a data I/O circuit 122 of the memory device 120. The data I/O circuits 112 and 122 constitute the SBD I/O circuit so that data is transmitted in two directions from the controller 110 to the memory device 120 and from the memory device 120 to the controller 110.

The address bus line CA is connected between a command address output buffer 114 of the controller 110 and a command address input buffer 124 of the memory device 120 so that a command address output from the controller 110 is input into the memory device 120. In other words, the command address is transmitted in a single direction from the controller 110 to the memory device 120.

As memory systems develop to operate at faster operating speeds, the command address is transmitted at a relatively fast rate, and as a result, errors in the transmitted command address are more likely to occur.

SUMMARY OF THE INVENTION

Embodiments of the present invention provide a memory system using a simultaneous bi-directional input/output (SBD I/O) circuit on an address bus line.

According to embodiments of the present invention, a memory system utilizes simultaneous bidirectional communication on an address bus line. The memory system includes a first address input/output circuit, a second input/output circuit, and an error correction circuit. The first address input/output circuit is connected to the address bus line. The first address input/output circuit transmits an address signal to the address bus line and receives an acknowledgement signal from the address bus line. The second address input/output circuit is connected to the address bus line. The second address input/output circuit transmits the acknowledgement signal to the address bus line and receives the address signal from the address bus line. The error correction circuit unit generates the acknowledgement signal which indicates whether an error is present in the address signal received by the second address input/output circuit.

According to embodiments of the present invention, a memory system simultaneously implements bi-directional communication on an address bus line. The memory system includes a first address input/output circuit, a second address input/output circuit, and an error correction circuit unit. The first address input/output circuit is connected to the address bus line. The first address input/output circuit transmits an address signal to the address bus line and receives an acknowledgement signal from the address bus line. The second address input/output circuit is connected to the address bus line. The second address input/output circuit transmits the acknowledgement signal to the address bus line and receives the address signal from the address bus line. The error correction circuit unit generates the acknowledgement signal indicating whether an error is present in the address signal received by the second address input/output circuit.

Accordingly, simultaneous bi-directional communication may be implemented on a data line in the memory system, so that the address signal and the corresponding acknowledgement signal can be transmitted and received by way of simultaneous bi-directional communication.

BRIEF DESCRIPTION OF THE DRAWINGS

Aspects and features of the present invention will become readily apparent from the detailed description that follow, with reference to the accompanying drawings, in which.

DETAILED DESCRIPTION OF THE INVENTION

Figure 2:
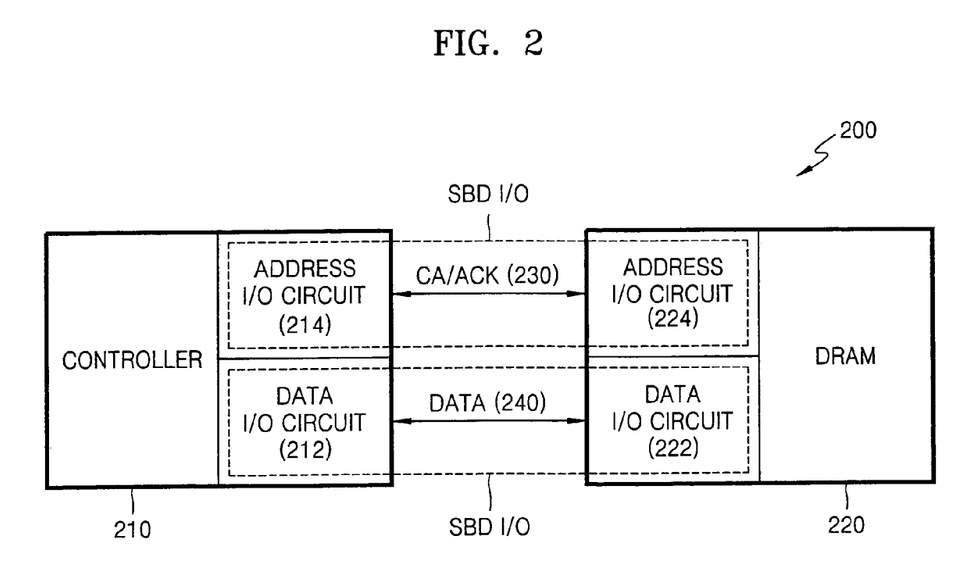
FIG. 2 illustrates a memory system having a signal transmission system, according to embodiments of the present invention.

FIG. 2 is a conceptual diagram illustrating a memory system according to embodiments of the present invention. A memory system 200 includes a controller 210 and dynamic random access memory (DRAM) 220 connected to each other via an address bus line 230 and a data bus line 240. The address bus line 230 is connected between an address input/output (I/O) circuit 214 of the controller 210 and an address I/O circuit 224 of the DRAM 220, so that a command address (CA) signal and an acknowledgement (ACK) signal are transmitted. The data bus line 240 is connected between a data I/O circuit 212 of the controller 210 and a data I/O circuit 222 of the DRAM 220, so that data can be transmitted. The address bus line 230 and the data bus line 240 allow simultaneous bi-directional communication. The number of address bus lines 230 and the number of data bus lines 240 may vary with the design and performance parameters of the memory system 200.

Figure 3:
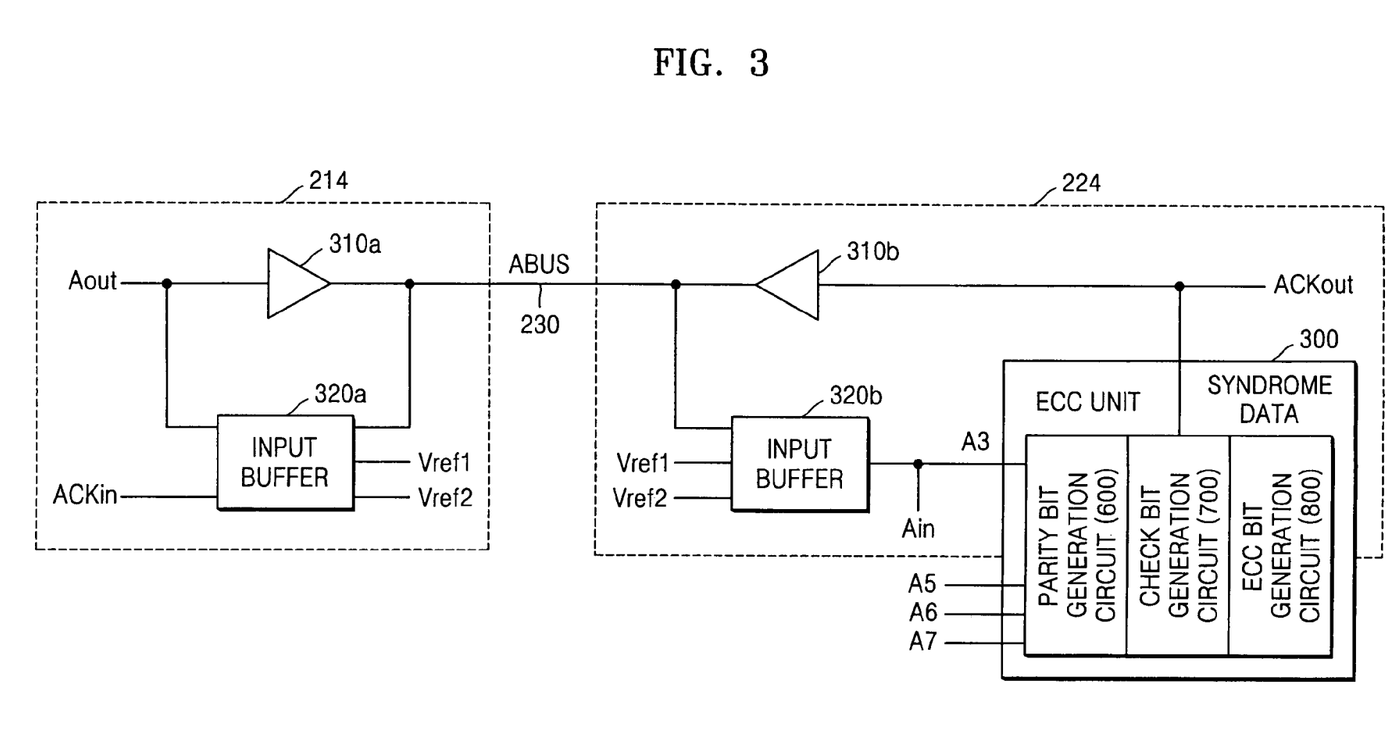
FIG. 3 is a block diagram illustrating simultaneous bi-directional communication on an address bus line, according to embodiments of the present invention.

FIG. 3 is a block diagram illustrating simultaneous bi-directional communication on a single address bus line (ABUS) 230. Referring to FIG. 3, the ABUS 230 is between a first address I/O circuit 214 and a second address I/O circuit 224. The first address I/O circuit 214 outputs an output address signal Aout to the ABUS 230 and generates an input ACK signal ACKin according to a change in voltage of the ABUS 230. The second address I/O circuit 224 provides the output address signal Aout transmitted via the ABUS 230 as an input address signal Ain and outputs an output ACK signal ACKout to the ABUS 230.

The first address I/O circuit 214 includes an output driver 310a and an input buffer 320a. The output driver 310a drives the ABUS 230 in response to the output address signal Aout. The input buffer 320a generates the input ACK signal ACKin in response to a changed voltage level of the ABUS 230 and levels of first and second reference voltages Vref1 and Vref2. The output address signal Aout is an address signal provided from the controller 210, shown in FIG. 2, to the DRAM 220 and may be used as a command designating an operating mode of the DRAM 220 or as a memory cell addressing signal. The input ACK signal ACKin is a signal provided to the controller 210 to report whether an address signal transmitted to the DRAM 220 has been correctly received by the DRAM 220.

Figure 4:
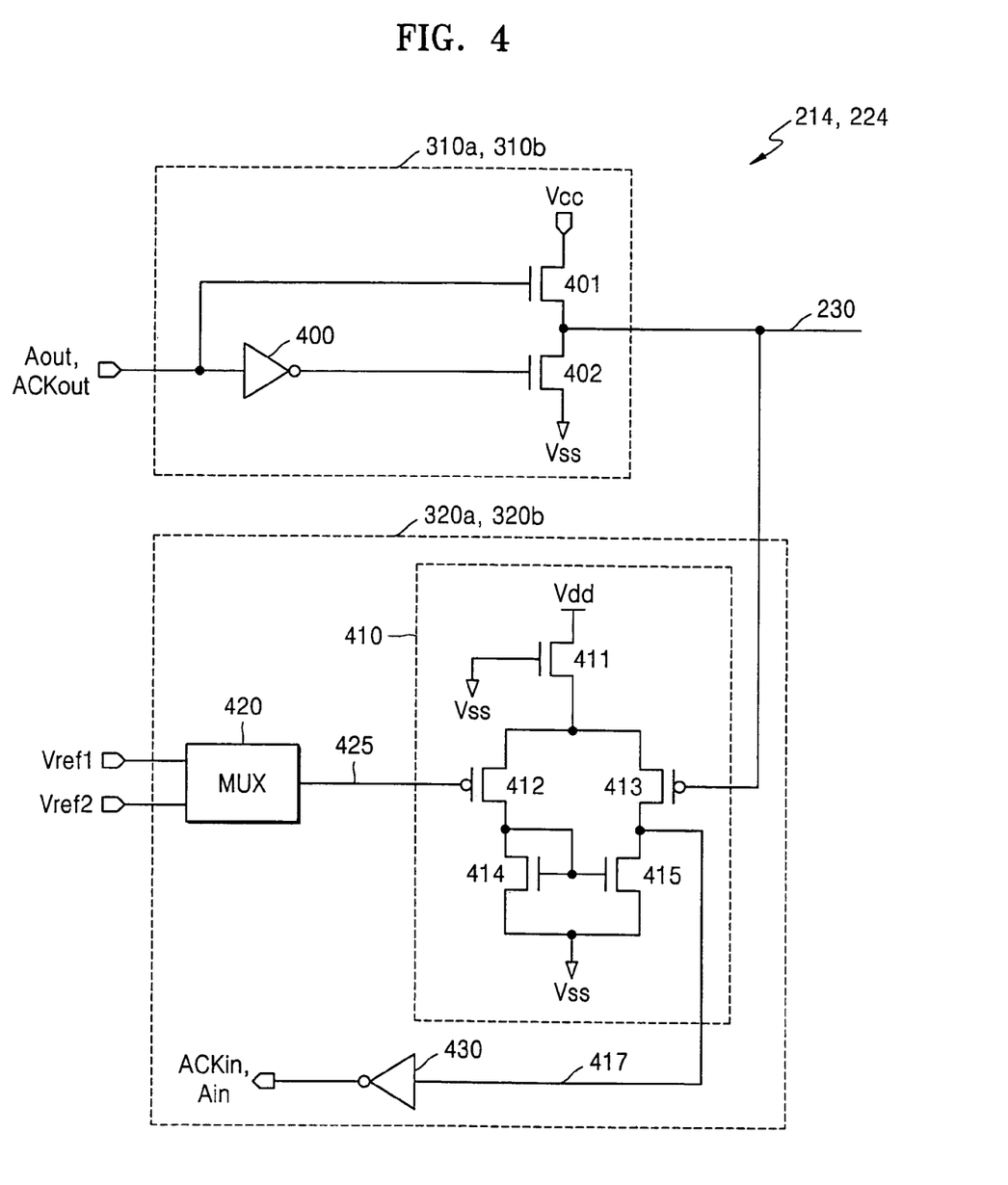
FIG. 4 is a detailed diagram illustrating a first address input/output (I/O) circuit, according to embodiments of the present invention.

FIG. 4 is a detailed diagram of the first address I/O circuit 214. The output driver 310a includes an inverter 400 and first and second N-type metal oxide semiconductor (NMOS) transistors 401 and 402. The inverter 400 receives the output address signal Aout. The transistors 401 and 402 are connected in series between a first power supply voltage Vcc and a ground voltage Vss. The gate of the first NMOS transistor 401 is connected with the output address signal Aout. The gate of the second NMOS transistor 402 is connected with an output of the inverter 400.

When the output address signal Aout is at a logic "high" level, the first NMOS transistor 401 is turned on and the second NMOS transistor 402 is turned off. As a result, the ABUS 230 is driven to the logic "high" level. When the output address signal Aout is at a logic "low" level, the first NMOS transistor 401 is turned off and the second NMOS transistor 402 is turned on. As a result, the ABUS 230 is driven to the logic "low" level. In other words, the output driver 310a drives the ABUS 230 according to the logic level of the output address signal Aout.

The input buffer 320a includes a differential amplifier 410, a multiplexer (hereinafter, referred to as a MUX) 420, and an inverter 430. The differential amplifier 410 includes a current source P-type MOS (PMOS) transistor 412 having a source connected with a second power supply voltage Vdd, a gate connected with the ground voltage Vss, and a drain connected with a differential pair. The differential pair includes first and second PMOS transistors 412 and 413. Sources of the first and second PMOS transistors 412 and 413 are connected with the drain of the current source PMOS transistor 411. The gate of the first PMOS transistor 412 is connected with one of the first and second reference voltages Vref1 and Vref2, based on the output of the MUX 420. A gate of the second PMOS transistor 413 is connected with the ABUS 230. Drains of the first and second PMOS transistors 412 and 413 are connected to drains, respectively, of third and fourth NMOS transistors 414 and 415. Third and fourth NMOS transistors 414 and 415 form a current mirror. Gates of the third and fourth NMOS transistors 414 and 415 are commonly connected with each other. The gate of the third NMOS transistor 414 is connected to the drain of the third NMOS transistor 414. Sources of the third and fourth NMOS transistors 414 and 415 are connected with the ground voltage Vss.

The MUX 420 selects and transmits one of the first and second reference voltages Vref1 and Vref2 to a reference node 425. The differential amplifier 410 compares a voltage level of the reference node 425 and a voltage level of the ABUS 230. If the voltage level (i.e. Vref1 or Vref2) of the reference node 425 is higher than the voltage level of the ABUS 230, the differential amplifier 40 drives an output line 417 to the logic "high" level and the input ACK signal ACKin is driven to the logic "low" level by the inverter 430.

If the voltage level (i.e. Vref1 or Vref2) of the reference node 425 is lower than the voltage level of the ABUS 230, the differential amplifier 410 drives the output line 417 to the logic "low" level and the input ACK signal ACKin is driven to the logic "high" level by the inverter 430. Accordingly, the input buffer 320a senses a voltage of the ABUS 230 and drives the input ACK signal ACKin according to one of the two reference voltages Vref1 and Vref2.

Referring to FIG. 3, the second address I/O circuit 224 is similar to the first address I/O circuit 214. The second address I/O circuit 224 includes an output driver 310b and an input buffer 320b. The input driver 310b drives the ABUS 230 in response to the output ACK signal ACKout. The input buffer 320b provides the input address signal Ain in response to the voltage level of the ABUS 230 and the levels of the first and second reference voltages Vref1 and Vref2. The output ACK signal ACKout is provided from an error correction circuit (ECC) unit 300 and verifies whether the input address signal Ain received by the DRAM 220 is transmitted without error.

The first address I/O circuit 214 drives the ABUS 230 in response to the output address signal Aout and drives the input ACK signal ACKin in response to a changed voltage level of the ABUS 230 driven by the second address I/O circuit 224. Similarly, the second address I/O circuit 224 drives the ABUS 230 in response to the output ACK signal ACKout and drives the input address signal Ain in response to the output address signal Aout (driven by the first address I/O circuit 214) of the ABUS 230.

Figure 5:
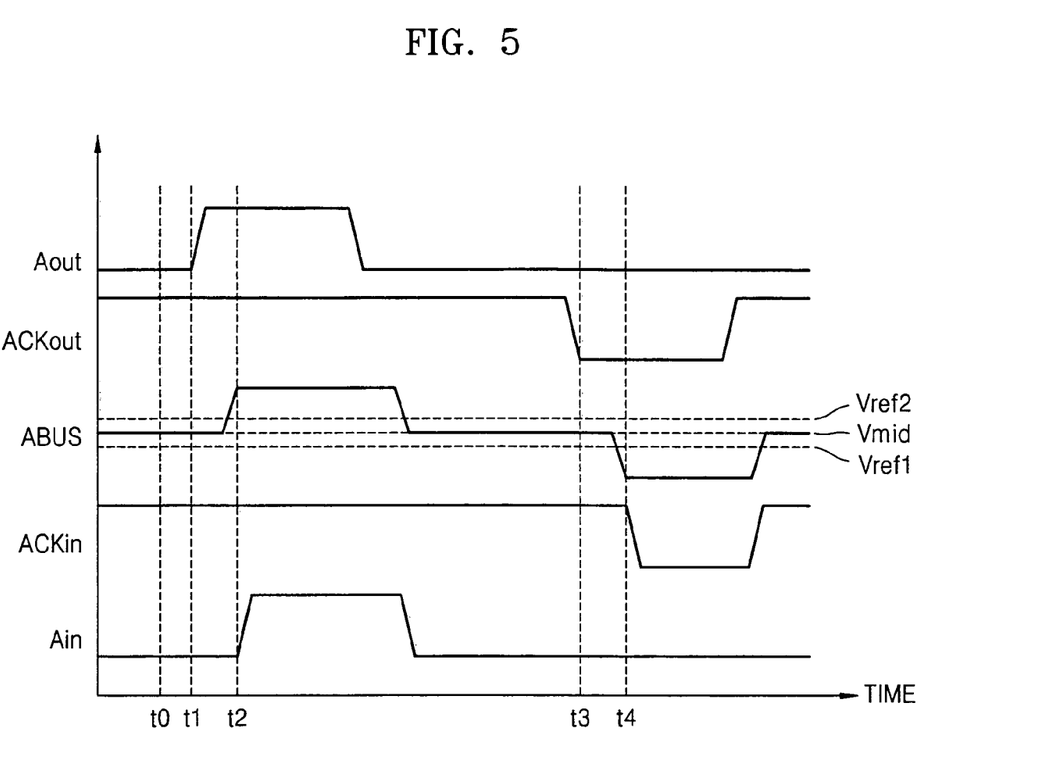
FIG. 5 is a timing chart, illustrating operations of an address I/O circuits, according to embodiments of the present invention.

FIG. 5 is a timing chart associating the operations of the first and second address I/O circuits 214 and 224. At time t0, the first address I/O circuit 214 drives the ABUS 230 at a logic "low" level, in response to a logic "low" level of the output address signal Aout. At the same time, the second address I/O circuit 224 drives the ABUS 230 at a logic "high" level, in response to the output ACK signal ACKout at a logic "high" level. As a result, the ABUS 230 becomes a mid-voltage Vmid between the power supply voltage Vcc and the ground voltage Vss. In other words, at time t0, the voltage level of signal Aout and the voltage level of the signal ACKout cancel each other out to the voltage Vmid.

The differential amplifier 410 of the first address I/O circuit 214 receives the mid-voltage Vmid of the ABUS 230 and the first reference voltage Vref1 (which is lower than the mid-voltage Vmid). As a result, the output line 417 in the first address I/O circuit 214 is driven to the logic "low" level and the input ACK signal ACKin becomes the logic "high" level. Likewise, the differential amplifier 410 of the second address I/O circuit 224 receives the mid-voltage Vmid of the ABUS 230 and the second reference voltage Vref2 (which is higher than the mid-voltage Vmid). As a result, the output line 417 in the second address I/O circuit 224 is driven to the logic "high" level and the input address signal Ain becomes the logic "low" level.

At a time t1, the output address signal Aout makes transition from the logic "low" level to the logic "high" level. Accordingly, the voltage level of the ABUS 230 is increased by the output driver 310a of the first address I/O circuit 214. The ABUS 230 is charged to the logic "high" level higher than the second reference voltage Vref2. At a time t2, the differential amplifier 410 of the second address I/O circuit 224 compares the voltage level of the ABUS 230 (which is higher than the second reference voltage Vref2) with the second reference voltage Vref2. The differential amplifier 410 of the second address I/O circuit 224 outputs the logic "low" level to the output line 417, generating the input address signal Ain at the logic "high" level at time t2.

At a time t3, the output ACK signal ACKout makes transition from the logic "high" level to the logic "low" level. The voltage level of the ABUS 230 is decreased by the output driver 310b of the second address I/O circuit 224. If the voltage level of the ABUS 230 is decreased below the first reference voltage Vref1, at a time t4, the differential amplifier 410 of the first address I/O circuit 214 compares the voltage level of the ABUS 230 (which is lower than the first reference voltage Vref1) with the first reference voltage Vref1. The differential amplifier 410 of the first address I/O circuit 214 outputs the logic "high" level to the output line 417, generating the input ACK signal ACKin at the logic "low" level at time t4.

In other words, the first and second address I/O circuits 214 and 224 enable the DRAM 220 to receive the input address signal Ain at the same logic level as the output address signal Aout output from the controller 210. The first and second address I/O circuits 214 and 224 enable the controller 210 to receive the input ACK signal ACKin at the same logic level as the output ACK signal ACKout output from the DRAM 220. Accordingly, an address signal and an ACK signal can be transmitted and received via the ABUS 230, by way of simultaneous bi-directional communication.

The output ACK signal ACKout (output from the DRAM 220) is generated by the ECC unit 300. The ECC unit 300 detects whether an address signal transmitted from the controller 210 to the DRAM 220 has an error, corrects an error, and internally transmits the address signal. In FIG. 3, only a single address signal and its ACK signal are transmitted via the ABUS 230 between the first and second address I/O circuits 214 and 224. However, actually, a plurality of address signals may be transmitted via a plurality of address bus lines between the controller 210 and the DRAM 220.

For clarity of the description, the ECC unit 300 will be described using an 8-bit address bus line. However, one of ordinary skill in the art can appreciate other parallel capacities for the address bus line. The ECC unit 300 includes a parity bit generation circuit 600. The parity bit generation circuit 600 selects four 1-bit address signals (e.g. address signals A3, A5, A6, and A7) from the eight 1-bit address signals. The parity bit generation circuit 600 generates three parity bits P1, P2, and P4 by combining the selected 1-bit address signals. A check bit generation circuit 700 generates syndrome data using the four 1-bit address signals A3, A5, A6, and A7 and the three parity bits P1, P2, and P4. An ECC 800 corrects an error in an address signal in response to the syndrome data.

Figure 6:
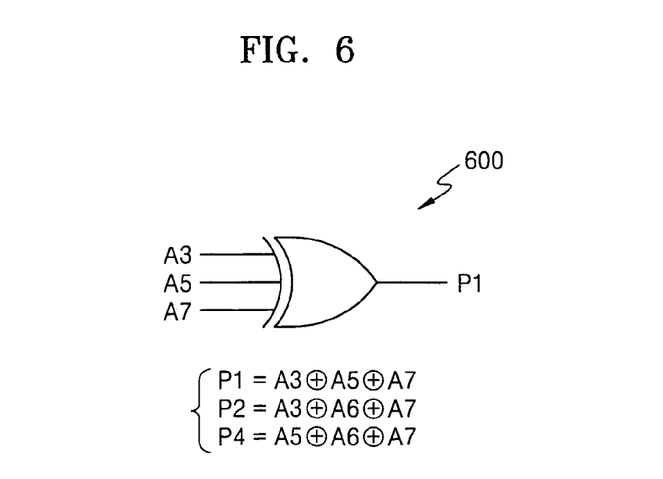
FIG. 6 is a diagram illustrating a parity bit generation circuit within an error correction circuit (ECC) unit, according to embodiments of the present invention.

Referring to FIG. 6, the parity bit generation circuit 600 generates the three parity bits P1, P2, and P4 by selectively exclusive-ORing the four 1-bit address signals A3, A5, A6, and A7. The parity bit P1 is generated by exclusive-ORing the address signals A3, A5, and A7. The parity bit P2 is generated by exclusive-ORing the address signals A3, A6, and A7. The parity bit P3 is generated by exclusive-ORing the address signals A5, A6, and A7. Accordingly, the bits P1, P2, A3, P4, A5, A6, and A7 constitute an ECC word.

Figure 7:
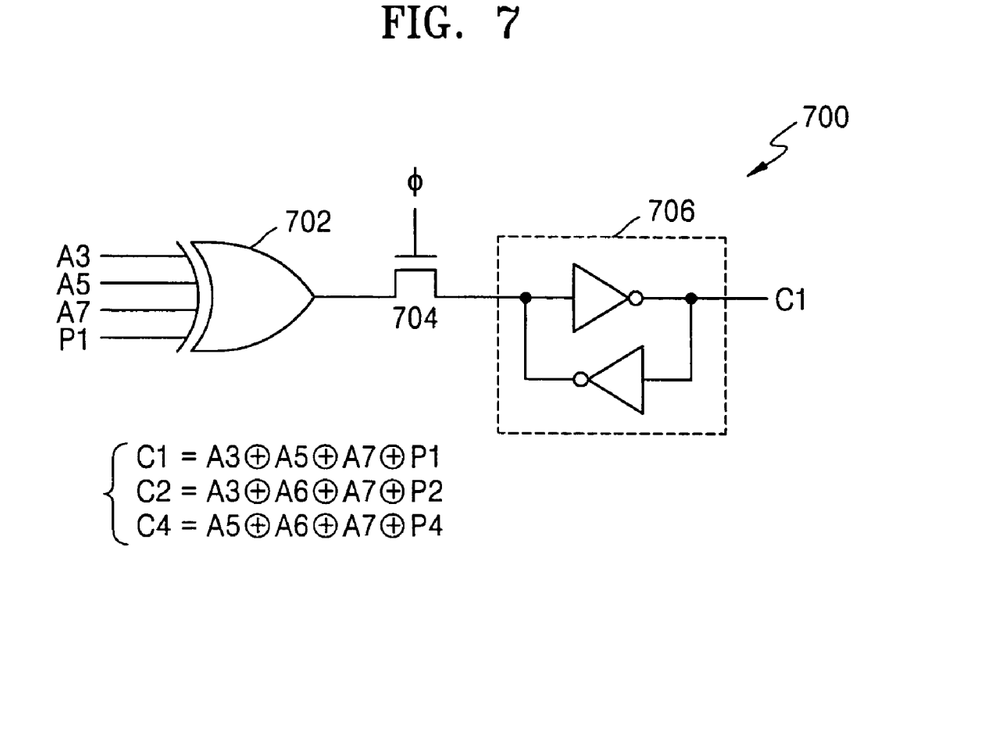
FIG. 7 is a diagram illustrating a check bit generation circuit within an ECC unit, according to embodiments of the present invention.

Referring to FIG. 7, the check bit generation circuit 700 checks whether an error is present in bit information of the ECC word [P1, P2, A3, P4, A5, A6, A7] and generates three check bits C1, C2, and C4. The check bit generation circuit 700 includes an exclusive OR gate 702, a transistor 704, and a latch 706. The exclusive OR gate 702 exclusive-ORs address signals and a parity bit. The transistor 704 transmits an output of the exclusive OR gate 702 in response to a clock signal φ. The latch 706 latches the output of the exclusive OR gate 702 transmitted by the transistor 704. The check bit C1 is generated by latching a result of the exclusive-ORing of the address signals A3, A5, and A7 and the parity bit P1, in response to the clock signal φ. The check bit C2 is generated by latching a result of exclusive-ORing the address signals A3, A6, and A7 and the parity bit P2, in response to the clock signal φ. The check bit C3 is generated by latching a result of exclusive-ORing the address signals A5, A6, and A7 and the parity bit P3, in response to the clock signal φ. The check bits C1, C2, and C4 constitute syndrome data. This 3-bit syndrome data indicates a position of an address signal having an error among the eight bit-address signals.

Figure 8:
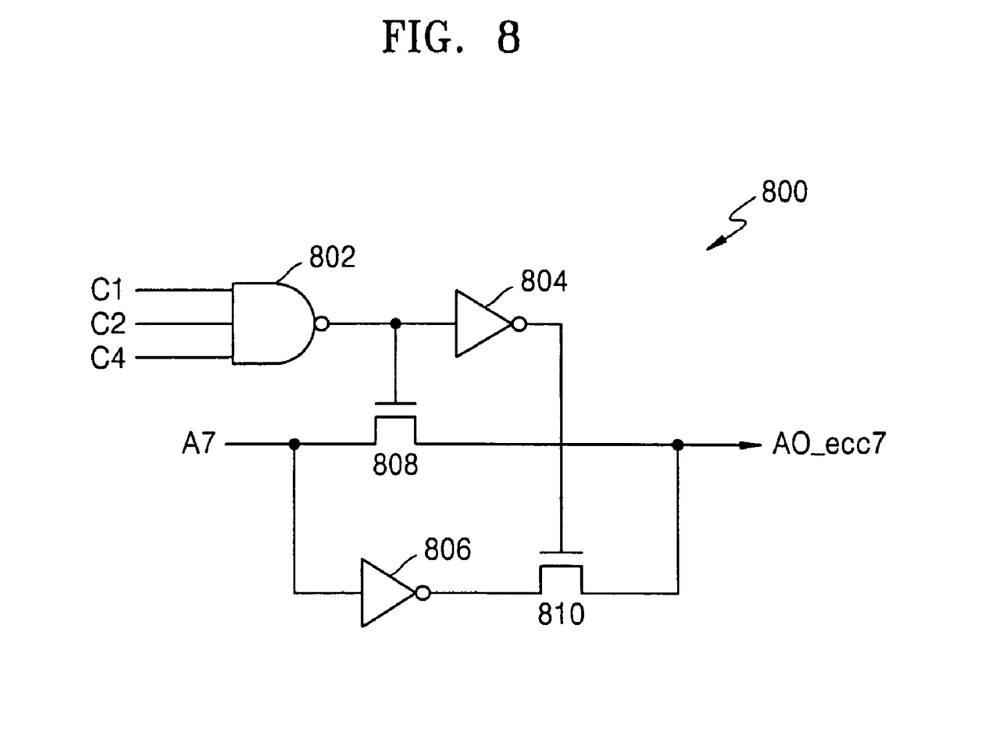
FIG. 8 is a diagram illustrating an ECC within the ECC unit shown in FIG. 3.

Referring to FIG. 8, the ECC 800 corrects an error in an address signal at a position corresponding to the syndrome data, including the check bits C1, C2, and C4. The ECC 800 is disposed per eight bit-address signals. In embodiments of the present invention, it is determined if the address signal A7 has an error; if there is an error, error correction is performed.

The ECC 800 includes a NAND gate 802, a first inverter 804, a second inverter 806, a first NMOS transistor 808, and a second NMOS transistor 810. The NAND gate 802 receives the check bits C1, C2, and C4. The first inverter 804 receives an output of the NAND gate 802. The second inverter 806 receives the address signal A7. The first NMOS transistor 808 transmits the address signal A7 as an error-corrected A7 address signal AO_ecc7, in response to the output of the NAND gate 802. The second NMOS transistor 810 transmits an output of the second inverter 806 as the error-corrected A7 address signal AO_ecc7, in response to an output of the first inverter 804. Where all of the check bits C1, C2, and C4 are logically "111" (i.e. where the syndrome data indicates that the address signal A7 has an error), the output of the second inverter 806 (i.e. an inverted A7 address signal) is generated as the error-corrected A7 address signal AO_ecc7 by the second NMOS transistor 810. In other words, where an error is present in the address signal A7, the address signal A7 is inverted to correct the error. Where any one of the check bits C1, C2, and C4 is logically "0" (i.e. where the syndrome data indicates that an error is not present in the address signal A7), the address signal A7 is generated as the error-corrected A7 address signal AO_ecc7 by the first NMOS transistor 808. In other words, error correction is not performed on the address signal A7. Accordingly, error correction is performed on eight bit-address signals, and a result of error correction is used as an internal address signal of the DRAM 220 of FIG. 2.

The output ACK signal ACKout output from the ECC unit 300 shown in FIG. 3 is identical with the syndrome data including the check bits C1, C2, and C4. The syndrome data including the check bits C1, C2, and C4 indicates whether an error is present in an address signal at a corresponding position. When the syndrome data is logically "1", the output ACK signal ACKout indicates that no error is present in a corresponding address signal. Where the syndrome data is logically "0", the output ACK signal ACKout indicating that an error is present in a corresponding address signal is generated. The output ACK signal ACKout is received as the input ACK signal ACKin by the controller 210 shown in FIG. 2.

According to embodiments of the present invention, address I/O circuits connected via an address bus line can perform simultaneous bi-directional communication, when an address signal and an ACK signal are exchanged. In addition, transmission and reception of the address signal, the ACK signal, and data signals in packet units by way of simultaneous bi-directional I/O via a single bus line can be implemented using embodiments of the present invention. In embodiments of the present invention, an ECC unit selects four bit-address signals from eight parallel bit-address signals and generates three parity bits. However, in embodiments, the ECC unit may select sixteen bit-address signals from twenty-two parallel bit-address signals and generate six parity bits. Alternatively, the ECC unit may select sixty-four bit-address signals from seventy-two parallel bit-address signals and generate eight parity bits.

While this invention has been particularly shown and described with reference to example embodiments, it will be understood by those skilled in the art that various changes in form and details may be made therein without departing from the spirit and scope of the invention as defined by the appended claims. Therefore, the scope of the invention is defined not by the detailed description of the invention but by the appended claims.

What is claimed is:

1. A memory system, comprising:
    an address bus line;
    a first address input/output circuit connected to the address bus line, wherein the first address input/output circuit transmits an address signal to the address bus line and receives an acknowledgement signal which indicates if an error is present in the address signal from the address bus line; and
    a second address input/output circuit connected to the address bus line, wherein the second address input/output circuit transmits the acknowledgement signal to the address bus line and receives the address signal from the address bus line.

2. The memory system of claim 1, wherein the first address input/output circuit is comprised in a controller of the memory system.

3. The memory system of claim 1, wherein the first address input/output circuit comprises:
    an output driver which outputs the address signal to the address bus line; and
    an input buffer which receives the acknowledgement signal from the address bus line as an input acknowledgement signal, according to a voltage level of the address bus line and a reference voltage level.

4. The memory system of claim 3, wherein the input buffer comprises a differential amplifier which compares the voltage level of the address bus line and the reference voltage level.

5. The memory system of claim 1, wherein the second address input/output circuit is comprised in a memory device within the memory system.

6. The memory system of claim 1, wherein the second address input/output circuit comprises:
    an output driver which outputs the acknowledgement signal to the address bus line; and
    an input buffer which receives the address signal from the address bus line as an input address signal, in response to a voltage level of the address bus line and a reference voltage level.

7. The memory system of claim 6, wherein the input buffer comprises a differential amplifier which compares the voltage level of the address bus line and the reference voltage level.

8. The memory system of claim 1, wherein the first input/output circuit is comprised in a controller of the memory system, wherein the second input/output circuit is comprised in a memory device of the memory system, and wherein said memory system further comprises simultaneous bi-directional data line coupled between the controller and the memory device.

9. A memory system, comprising:
    an address bus line;
    a first address input/output circuit connected to the address bus line, wherein the first address input/output circuit transmits an address signal to the address bus line and receives an acknowledgement signal from the address bus line;
    a second address input/output circuit connected to the address bus line, wherein the second address input/output circuit transmits the acknowledgement signal to the address bus line and receives the address signal from the address bus line; and
    an error correction circuit unit which generates the acknowledgement signal, wherein the acknowledgment signal indicates if an error is present in the address signal received by the second address input/output circuit.

10. The memory system of claim 9, wherein the error correction circuit unit corrects an error in the address signal.

11. The memory system of claim 9, wherein the error correction circuit unit comprises:
    a parity bit generation circuit which generates "p" parity bits by combining "m" bit-address signals received from the address bus line;

a check bit generation circuit which generates "c" check bits by combining the "m" bit-address signals and the "p" parity bits; and an error correction circuit which corrects an error in the "m" bit-address signals in response to syndrome data comprising the "c" check bits.

12. The memory system of claim 11, wherein the parity bit generation circuit generates the "p" parity bits by selectively subjecting the "m" bit-address signals to an exclusive-OR operation.

13. The memory system of claim 11, wherein the check bit generation circuit generates the syndrome data comprising the "c" check bits by selectively exclusive-ORing the "m" bit-address signals and the "p" parity bits and latching a result of the exclusive-ORing in response to a clock signal.

14. The memory system of claim 13, wherein the syndrome data indicates a position of an address signal having an error among the "m" bit-address signals.

15. The memory system of claim 11, wherein the error correction circuit comprises:
   a NAND gate which receives the syndrome data;
   a first inverter which receives an output of the NAND gate;
   a second inverter which receives a bit-address signal among the "m" bit-address signals;
   a first N-type metal oxide semiconductor (NMOS) transistor which transmits the bit-address signal as an error-corrected bit-address signal in response to the output of the NAND gate; and
   a second NMOS transistor which transmits an output of the second inverter as the error-corrected bit-address signal, in response to an output of the first inverter.

16. The memory system of claim 9, wherein the first address input/output circuit is comprised in a controller within the memory system.

17. The memory system of claim 9, wherein the first address input/output circuit comprises:

an output driver which outputs the address signal to the address bus line; and an input buffer which receives the acknowledgement signal from the address bus line as an input acknowledgement signal, according to a voltage level of the address bus line and a reference voltage level.

18. The memory system of claim 17, wherein the input buffer comprises a differential amplifier which compares the voltage level of the address bus line and the reference voltage level.

19. The memory system of claim 9, wherein the second address input/output circuit is comprised in a memory device.

20. The memory system of claim 9, wherein the second address input/output circuit comprises:
   an output driver which outputs the acknowledgement signal to the address bus line; and
   an input buffer which receives the address signal from the address bus line as an input address signal, in response to a voltage level of the address bus line and a reference voltage level.

21. The memory system of claim 20, wherein the input buffer comprises a differential amplifier which compares the voltage level of the address bus line and the reference voltage level.

22. The memory system of claim 9, wherein the first input/output circuit is comprised in a controller of the memory system, wherein the second input/output circuit is comprised in a memory device of the memory system, and wherein said memory system further comprises simultaneous bi-directional data line coupled between the controller and the memory device.

* * * * *